United States Patent [19]

Harada et al.

[11] Patent Number: 4,543,601
[45] Date of Patent: Sep. 24, 1985

[54] SOLID STATE IMAGE SENSOR WITH HIGH RESOLUTION

[75] Inventors: Nozomu Harada; Okio Yoshida, both of Yokohama, Japan

[73] Assignee: Tokyo Shibaura Denki Kabushiki Kaisha, Kawasaki, Japan

[21] Appl. No.: 451,465

[22] Filed: Dec. 20, 1982

[30] Foreign Application Priority Data

Dec. 25, 1981 [JP] Japan .................. 56-209381
Mar. 15, 1982 [JP] Japan .................. 57-39429

[51] Int. Cl.[4] .............................. H01J 3/14
[52] U.S. Cl. ................... 358/213; 358/212; 358/209; 250/216; 250/578
[58] Field of Search ........ 250/216, 578; 358/213, 358/209, 212

[56] References Cited

U.S. PATENT DOCUMENTS 4,383,170 5/1983 Takagi et al. .................. 250/216

FOREIGN PATENT DOCUMENTS 0067043 12/1982 European Pat. Off. .

OTHER PUBLICATIONS

IEEE Transactions of Electron Devices, vol. ED-20, No. 6, Jun. 1973, "Interlacing in Charge-Coupled Imaging Devices", pp. 539-541, Carlo H. Sequin.

K. A. Hoagland: "Television Applications of Interline--Transfer CCD Arrays", NASA/JPL Conference on Charge Coupled Device Tech. & Applications, Wash., D.C., Dec. 1976, pp. 152-156.

*Primary Examiner*—Gene Z. Rubinson
*Assistant Examiner*—Robert Lev
*Attorney, Agent, or Firm*—Oblon, Fisher, Spivak, McClelland & Maier

[57] ABSTRACT

There is disclosed a solid state image sensor including an interline transfer charge coupled device (IT-CCD) serving as an area image sensor and a vibrating plate for vibrating or swinging the IT-CCD in a plane orthogonal to an incident image light, horizontally, periodically and relatively to the incident image light in a given vibration mode. When the solid state image sensor is applied for NTSC television system in which one frame is composed of two fields, the IT-CCD is vibrated so that it senses an image at different positions during the two fields periods. As a result, a reproduced picture has a resolution which is obtained as if the number of picture elements of the image sensor per se is doubled.

12 Claims, 32 Drawing Figures

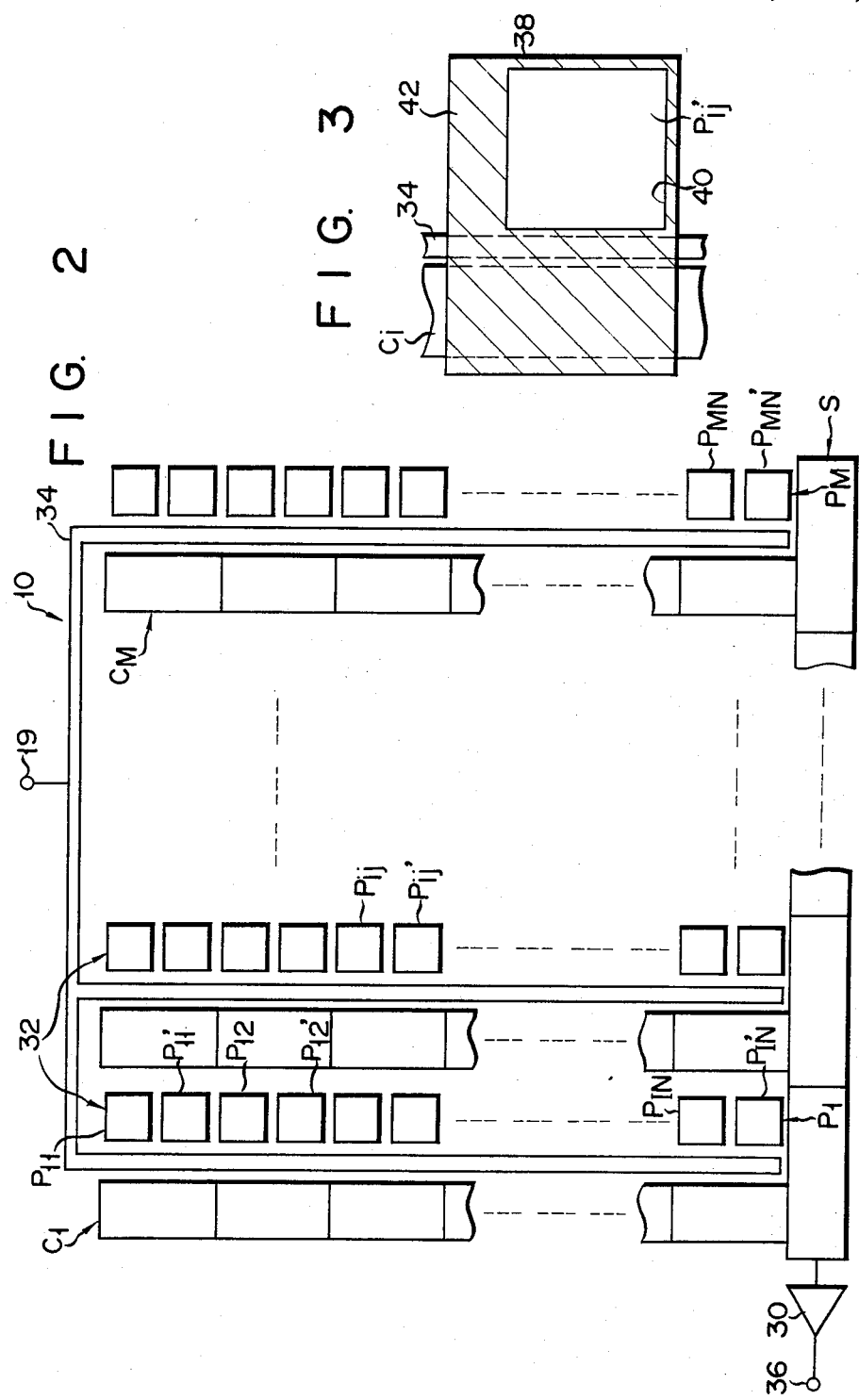

F I G. 4A
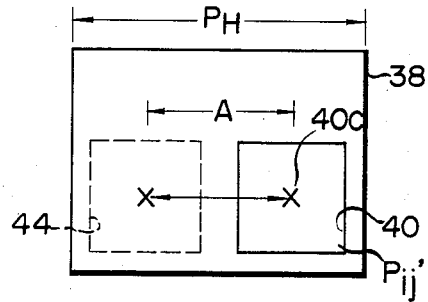
F I G. 4B
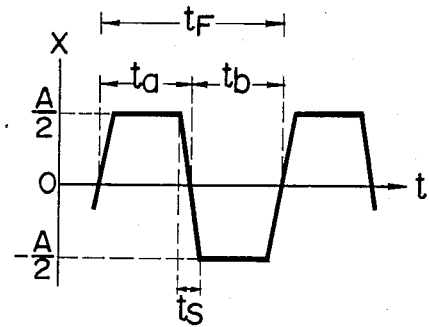
F I G. 5A
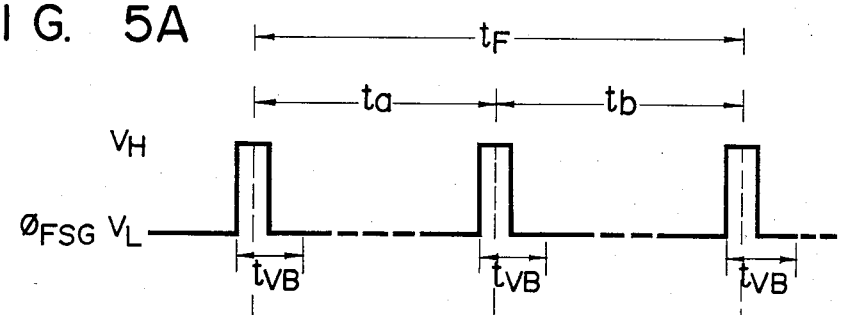
F I G. 5B
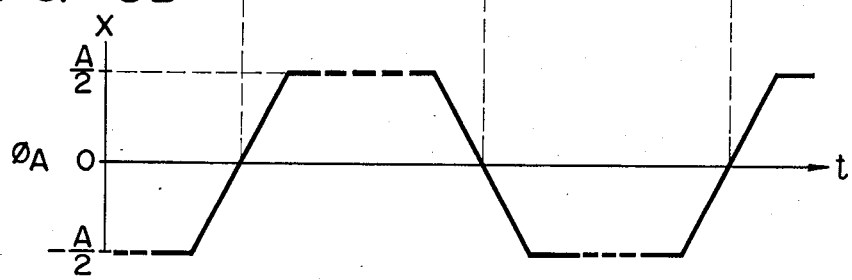

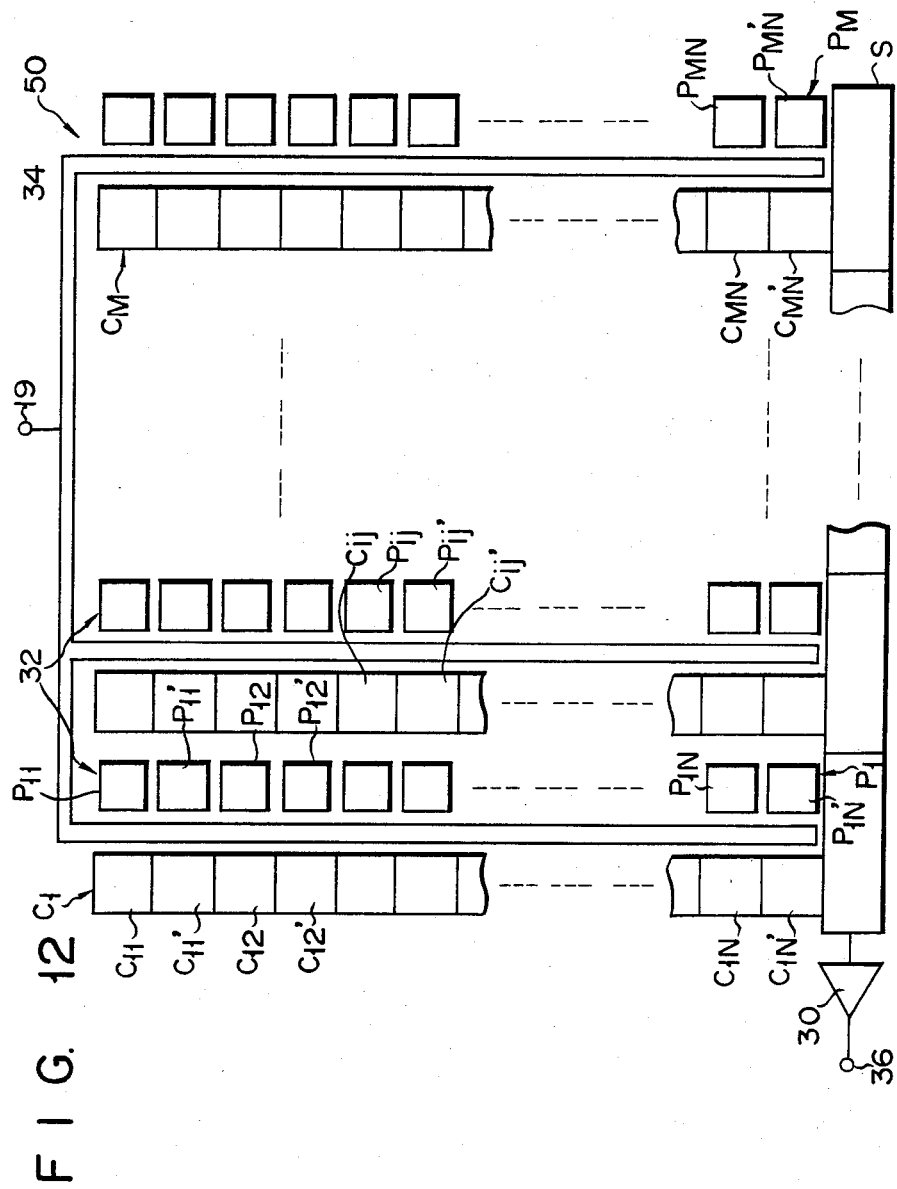

SOLID STATE IMAGE SENSOR WITH HIGH RESOLUTION

BACKGROUND OF THE INVENTION

The present invention relates to solid state image sensors, and more particularly to solid state image sensors for reproducing high definition images.

Charge transfer devices (CTD) such as charge coupled devices have been known as solid state image sensors adaptable for standard television system, for example, National Television Systems Committee (NTSC) system and have found a variety of applications. In NTSC system, the number of vertical scanning lines is 512, the scanning system is of an interlacing scanning type with two fields for one frame, and the aspect ratio is 3:4. The number of picture elements of a CCD adaptable for the standard TV system, for example, in interline transfer type CCD (IT-CCD) is approximately 500 (vertical) ×400 (horizontal).

The solid state image sensor such as the IT-CCD is superior to the conventional image pick-up tube in many points. For example, the image sensor is small in size, light in weight, and high in reliability. Further, it is essentially free from pattern distortion and sticking, and is little influenced by afterimage sensor. Having such excellent features provide a prospect of increasing applications in many fields. Example, ITV, small commercial video cameras which will supercede the conventional cameras using silver salt-film. For applying the image sensor for such fields, a remarkable resolution improvement of the reproduced picture is required for the solid state image sensor in order to ensure a high quality of picture.

High definition wide television systems, which can provide wide and high definition pictures are reagrded as the next generation television systems. The study of the high definition wide television system reports that the scanning lines must be 1,000 or more, for example, 1,125. To satisfy such requirement, the improvement of the resolution of the solid state image sensor is very significant.

The number of picture elements 500×400 of the currently used solid state image sensor, for example, IT-CCD, is too small to realize the high resolution. Therefore, it is considered that the number of picture elements must be remarkably increased. It is to be noted that the solid state image sensor currently used needs one of the largest chip sizes of LSIs. Therefore, if the number of picture elements is simply increased for the above purposes, the chip size of the image sensor is considerably increased. This leads to increase of the size and cost of the image sensor. On the other hand, if the number of picture elements is increased while keeping the present chip size of the image sensor, the integration density of the chip must be improved considerably, for example, four times or more. The LSI chips with such a high integration density, however, involve a difficulty in fabricating them by the presently existing fabricating technology. Even if in the future, the fabricating technology advances and realizes the solid state image sensors with a high integration density, a new problem arises that a drive system for such image sensors must be complicated and consume large power.

SUMMARY OF THE INVENTION

Accordingly, an object of the present invention is to provide a new and improved solid state image sensor with a high resolution.

Another object of the present invention is to provide a new and improved solid state image sensor having a resolution comparable with that of the solid state image sensor which has successfully increased the number of picture elements without increasing the chip size or the integration density of picture elements.

A solid state image sensor according to the present invention is provided with a solid state image sensing device such as a charge transfer device. The image sensing device includes a sensing section which receives incident radiation representing image information, generates and stores charges corresponding to the radiation, and at least one transfer section. The sensing section is provided with at least one train of cells including a predetermined number of cells. The transfer section is disposed adjacent to and extends along the cell train. The transfer section reads out and transfers the charges stored in the sensing section. The image sensor of the invention is further provided with a device for generating a vibration to provide a position reciprocal replacement of the cell train between the incident radiation and the image sensing device at given time periods. The vibration of the cell train is done for sensing the light image at different positions with respect to the incident radiation at different time points. With this arrangement, an effective image sensing area of the image sensing device is increased. Consequently, the resolution of the reproduced picture may be improved without increasing the integration density of the cell train. Thus, a fine and definite reproduced picture may be obtained.

BRIEF DESCRIPTION OF THE DRAWINGS

The present invention is best understood by reference to the accompanying drawings, in which:

FIG. 2 is a plan view of an image sensing area of an interline transfer charge coupled device (IT-CCD) of FIG. 1;

FIG. 3 is a partial plan view of an area in the image sensing area of FIG. 2, which corresponds to one picture element;

FIG. 4A illustrates a model of a vibration or swing of one picture element area in FIG. 3 for illustrating an IT-CCD swing mode in FIG. 1;

FIG. 4B shows a waveform of vibration of IT-CCD illustrated corresponding to one picture element area in FIG. 3A;

FIG. 5A is a waveform of an electrical signal supplied to a field shift gate (FSG) of IT-CCD in FIG. 1 during a period of one frame;

FIG. 5B shows a waveform of swing of the IT-CCD illustrated corresponding to the signal waveform of FIG. 5A;

FIG. 12 shows an arrangement of an IT-CCD which corresponds to the FIG. 2 IT-CCD of which the planar surface of the image sensing area is modified, with the vertical CCD having the same number of transfer stages as that of the number of picture elements of the cell line adjacent to the vertical CCD;

DETAILED DESCRIPTION OF THE PREFERRED EMBODIMENT

Figure 1:
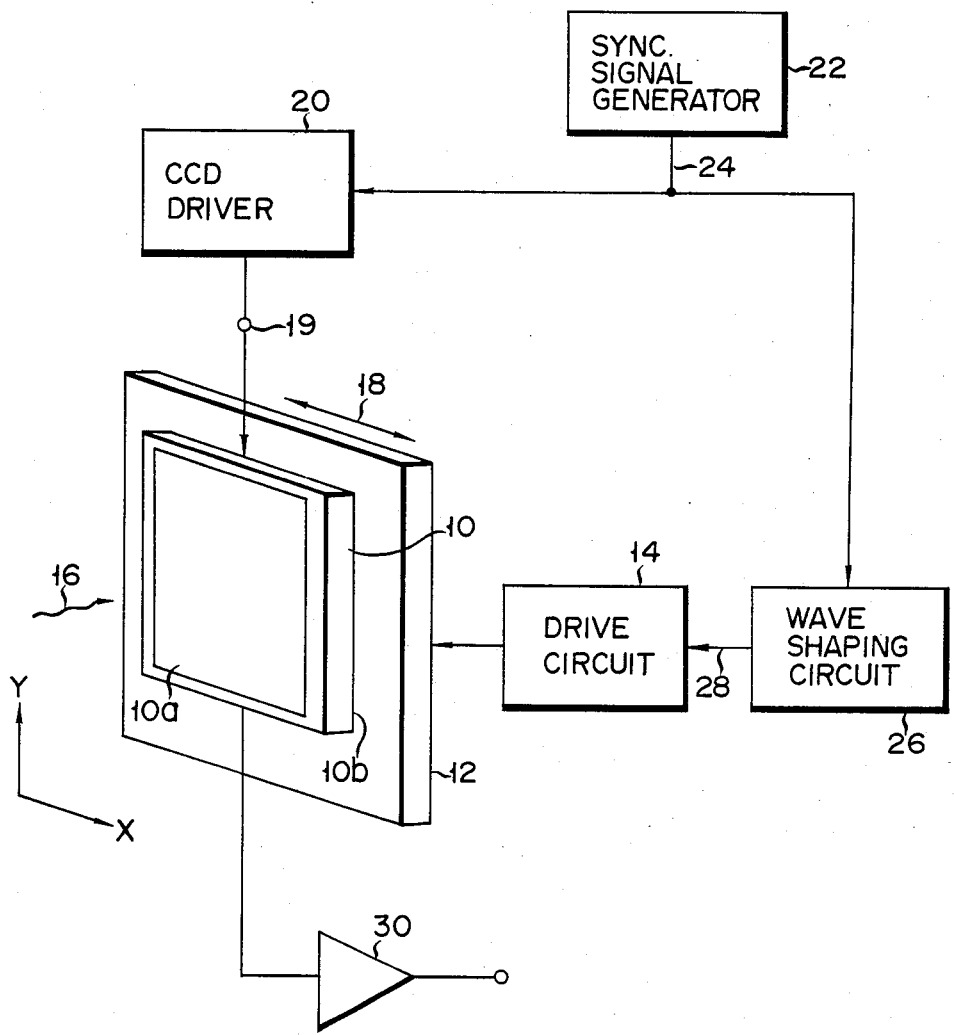
FIG. 1 is a block diagram showing an overall arrangement of a solid state image sensor according to one embodiment of the present invention.

Referring now to FIG. 1, there is schematically shown a solid state image sensor arrangement according to an embodiment of the present invention. The image sensor arrangement is so designed that a solid state image sensor per se vibrates or swings for incident light image. In FIG. 1, a solid stage image sensor, for example, an interline transfer charge coupled device (IT-CCD) 10 has an ordinary number of picture elements, for example, 500×400. The IT-CCD is fixed to a vibrating table 12, at the rear side 10b opposite to the image sensing area 10a. The vibrating table 12 vibrates or swings in a plane normal to the incident image rays 16, in a given direction, for example, a horizontal direction as indicated by an arrow 18. Accordingly, the IT-CCD 10 fixed to the vibrating table 12 vibrates or swings in the vibrating mode, too.

The IT-CCD 10 is electrically connected through a gate terminal 19 to a CCD driver 20. The CCD driver 20 responds to a sync pulse signal 24 generated by a sync signal generating circuit 22, thereby to mechanically drive the IT-CCD 10. The sync signal generating circuit 22 is also electrically connected to a wave shaping circuit 26 connected to the drive circuit 14. The wave shaping circuit 26 receives the sync pulse signal 24 from the sync signal generating circuit 22 and waveshapes the sync pulse signal 24 to produce a sync pulse signal 28 necessary for vibrating the vibrating table 12. The wave-shaped sync pulse signal 28 is supplied to the drive circuit 14 for vibrating the table 12. The output terminal of the vibrating or swinging IT-CCD 10 is connected to a video signal amplifier 30.

The IT-CCD 10 is provided with a photosensitive portion 32 made up of photosensitive elements, for example, photodiodes $P_{11}$, $P_{11}'$, $P_{12}$, $P_{12}'$, ..., $P_{1N}$, $P_{1N}'$, ..., $P_{ij}$, $P_{ij}'$, ..., $P_{MN}$, $P_{MN}'$. Of photodiodes P vertically arranged, the adjacent photodiodes are paired and designated by paired notation, as just above. This is done for making the notation of the photodiodes arrayed comply with the conventional one adaptable for NTSC system. These photodiodes P are arrayed on a CCD substrate (not shown) in a matrix fashion. In the matrix array each column includes photodiodes of 2N and the columns of M are arrayed side by side. M vertical CCDs $C_1$ to $C_M$ are disposed adjacent to the M photodiodes columns, respectively. The number of vertical CCDs $C_1$ to $C_M$ is equal to the number of vertical picture elements in the IT-CCD 10, that is, the half (N) of the number of photodiodes contained in each photodiode column. The vertical CCDs $C_1$ to $C_M$ are connected at their final transfer stage to a horizontal CCD shift register S. A field shift gate (FSG) 34 is arranged with the gate portions each extending through gaps between the vertical photodiode columns $P_1$ to $P_M$ and the vertical CCDs $C_1$ to $C_M$. The FSG 34 is electrically connected to the gate terminal 19. When a pulse signal (a gate control signal) is applied from the CCD driver 20 to the FSG 34 through the gate terminal 19, the signal charge stored in the photodiodes P is transferred to the vertical CCDs $C_1$ to $C_M$. The signal charge transferred to the vertical CCDs $C_1$ to $C_M$ is sequentially transferred to the horizontal CCD shift register S for each stage. The charge is then read out from the output terminal 36 through the amplifier 30.

FIG. 3 shows an enlarged plan view of an image sensing area corresponding to one picture element or one cell in the photosensitive portion 32 of the IT-CCD 10 in FIG. 2. A hatched portion 38 indicates an aluminum electrode serving to shut off the incident light. The Al electrode 38 has an opening 40 under which the photodiode $P_{ij}'$ is located. The vertical CCD $C_i$ and the FSG 34 run under the Al electrode 38, and hence are optically shielded from light rays by the Al electrode 38. An internal interconnection pattern (not shown) for driving the vertical CCD $C_i$ is formed under an area 42 of the Al electrode 38 located above the photodiode $P_{ij}$. The area 42 of the Al electrode 38 performs optical isolation between the photodiodes $P_{ij}$ and $P_{ij}'$.

The present embodiment is applied for the image sensing based on NTSC television system. Accordingly, the IT-CCD 10 is vibrated or swung horizontally in FIG. 1, i.e. in the horizontal direction, at a period corresponding to one frame period $t_F$ (two fields period) in the image sensing operation. The vibration mode (or swing mode) of the IT-CCD 10 will now be described referring to FIGS. 4 and 5.

FIG. 4A illustrates again the one cell area shown in FIG. 3 in a model, for explaining the swing mode of the IT-CCD 10. The IT-CCD 10 is swung, according to a vibration waveform as shown in FIG. 4B, so that during a field A in one frame period $t_F$, the opening 40 where the one cell $P_{ij}'$ of the IT-CCD 10 is located at a first location as indicated by a solid line in FIG. 4A, on the other hand, during a field B, it is positioned at a second location denoted by a dotted line 44. The swing width of the CCD is denoted as A. If the center of the swing in this coordinates system is 0, the CCD reciprocately swings a A/2 distance positively and negatively with respect to the center 0. If the period $t_S$ (FIG. 4B) that the center 40c of the opening 40 of the Al electrode 38 moves from $X=A/2$ to $-X=A/2$ is sufficiently shorter than the one frame period $t_F$, the opening center 40c, i.e. the center of the cell $P_{ij}'$, rests at $X=A/2$ during the field A period $t_a$. During the field B period $t_b$, it rests at $X=-A/2$. Since the amplitude A is set much smaller than the horizontal pitch length $P_H$, the cell has substantially two different spatial sampling areas in the horizontal direction during the one frame period $t_F$. While one cell $P_{ij}$ have typically been described, the same thing is true for the remaining cells.

In FIG. 5, there is shown a voltage signal waveform $\phi_{FSG}$ from the photosensitive portion to the FSG 34 for controlling the transfer of the signal charge to the vertical CCDs $C_1$ to $C_M$, and a time variation $\phi_A$ of the opening center 40c. As shown in FIG. 5A, the voltage signal from the CCD driver 20 in a pulse signal changing between a low level potential $V_L$ and a high level potential $V_H$. During the vertical blanking period $t_{VB}$ of the IT-CCD 10, the pulse component at high level potential $V_H$ is applied to the FSG 34 (FIG. 2). The signal charge stored in the photosensitive section 32 by image-sensing the incident image light rays is transferred through the FSG 34 to the vertical CCDs $C_1$ to $C_M$. The time variation waveform $\phi_A$ of position of the cell center 40c shown in FIG. 5B is so arranged as to cross the coordinate $X=0$ during the vertical blanking period $t_{VB}$ and within a period that the pulse signal from the CCD driver 20 shown in FIG. 5A is at $V_H$. Accordingly, the signal charge stored in the photosensitive section 32 during the field A period $t_a$ corresponds to the image light incident on the IT-CCD 10 when the IT-CCD 10 is positioned at $X=A/2$. The signal charge obtained during the field B period $t_b$ corresponds to the image light incident on the IT-CCD 10 when the IT-CCD 10 is at $X=-A/2$.

The IT-CCD 10 thus arranged according to the present invention, unlike the conventional IT-CCD picking up an image at the same position through the periods of fields A and B, may pick up an image from the incident image light at different positions during the periods of fields A and B. In reproducing the image thus formed, if the read out cell signals or the image picture signals of the fields A and B thus obtained are visualized spacially shifted in horizontal direction so as to be adapted for the aforementioned CCD sampling operation, the resolution of the reproduced picture can be improved essentially two times. In the present embodiment, the cell center 40c merely reciprocates in horizontal direction every field period. The horizontal reciprocal movement of the IT-CCD 10 has little adverse influence on the vertical resolution of the reproduced picture.

As described above, the present embodiment employs the solid state image sensor such as IT-CCD arranged such that the signal charge stored in the photosensitive section are simultaneously read out and transferred to the vertical CCD sections for each field and during the blanking period. The image sensor is vibrated or swinged in a vertical plane with respect to the incident image light. In more particular, during the periods of the fields A and B, the image sensor stops at two different positions. And during the blanking period, the image sensor reciprocately and radially moves between two different positions. With such an arrangement, the effective horizontal resolution may be doubled without deteriorating the vertical resolution, thus providing a fine and high quality picture reproduced.

Even if the fabrication technique in this field will further be increased and this technique may realize a solid state image sensor of which the picture elements are packed in density two times in horizontal direction, it should be noted that the image sensor of the present invention is advantageous over such image sensor with high integration density and has the following advantages.

(1) In the image sensor with highly density integration, the cell pitch is halved. Therefore, the saturation signal level is remarkably reduced to cause the dynamic range to be excessively narrower. On the other hand, the image sensor according to the present invention is free from such problem about the dynamic range characteristic. Further, it can excellently remove the deterioration of the picture quality (such as smear or blooming) which arises from the diffusion of the signal charge in the substrate when the integration density is increased and hence the distance between the photosensitive portion and the vertical CCD is made small. Thus, according to the present invention, the solid state image sensor with a wide dynamic range can be provided without using special and so high fabrication technique.

(2) On the image sensor with high integration density, the read speed of the cell signal (image-sensed signal) is substantially doubled. Many problems undesirably arises from this: for example, increase of power consumption and difficulty in circuit design on the circuits for driving the highly packed image sensor and the peripheral circuits for signal processing. The image sensor of the present invention is free from such problems.

(3) In the image sensor with high integration density, a ratio of each cell area to the substrate area is of necessity small. Accordingly, ratio of the opening area in each cell to the substrate area is also small and is never large. It can not be expected accordingly that the increase of the integration density brings about decrease of the ineffective area in the photosensitive area of such image sensor in collecting light image information. On the other hand, the image sensor according to the present invention can substantially collect the light image data from the area corresponding to the actual ineffective area by the vibration of the image sensor per se.

Thus, the image sensor of the present invention has an effectively wide area for collecting the optical image information.

As described above, how to set up a relationship between the time variation of position $\phi_A$ of the chip substrate of the swinging solid state image sensor and the signal charge read out operation, is one of the most important factor in realizing the high resolution of the reproduced picture.

Figure 6A:
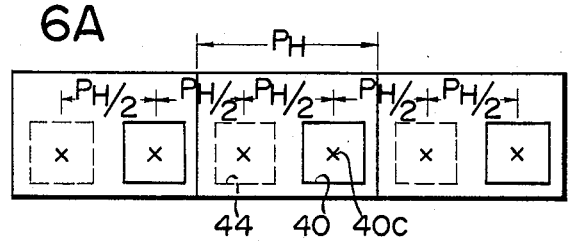
FIG. 6A illustrates a model of swing of a part of the image sensing area for explaining another swing mode of the IT-CCD of FIG. 1.
Figure 6B:
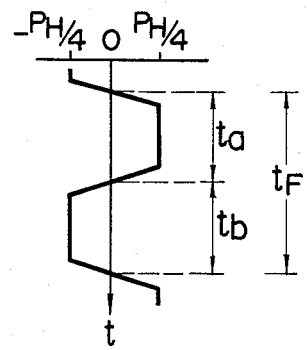
FIG. 6B is a waveform of another swing mode of the IT-CCD illustrated corresponding to the partial image sensing area of FIG. 6A.

FIG. 6 shows a modification of the swing mode of the aforementioned embodiment. In this swing mode, the opening center 40c in one cell area horizontally swings a distance of $P_H/4$ from its swing center in the positive and negative directions. The other fundamental swinging operations are similar to those in the above embodiment. The waveform on the graph of FIG. 6B, which represents a vibration of IT-CCD, is a trapezoidal waveshape.

A model of the image sensing cells reciprocatingly moving rest at two different positions during both fields A and B when the IT-CCD 10 is vibrated or swinged, is illustrated in FIG. 6A. The cell array as a model in FIG. 6A is illustrated for each frame period. In FIG. 6A, cell positions, as indicated by a solid line during a field A period and as indicated by a dotted line during a field B period, are arranged so as to be distanced by equal pitch length $P_H/2$ from one another. If the IT-CCD 10 is swinged under this cell array condition, it is possible to prevent generation of moiré signal. Therefore, the resolution of the reproduced picture may further be improved.

Figure 7A:
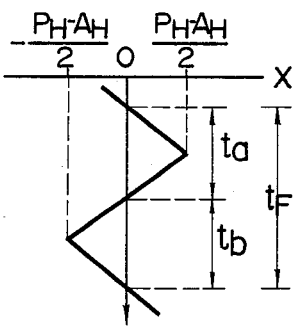
FIG. 7A illustrates a waveform of swing illustrating yet another swing mode of the IT-CCD.
Figure 7B:
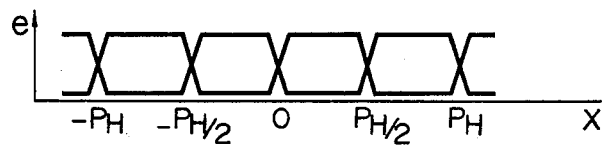
FIG. 7B illustrates an effective photosensing distribution of the IT-CCD vibrating in the swing mode of FIG. 7A.
Figure 7C:
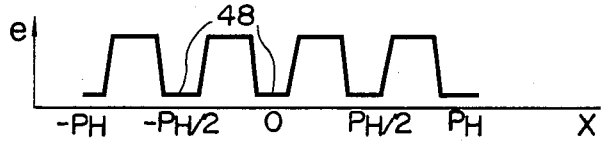
FIG. 7C shows an effective photosensing distribution of the IT-CCD vibrating in a trapezoidal wave swing mode shown in FIGS. 4B and 6B.

Turning now to FIG. 7, there is shown still another modification of swing mode of the embodiments shown in FIGS. 1 to 5. According to a "triangle swing mode" the IT-CCD horizontally swings with an amplitude $P_H$-$P_A$, where $A_H$ is a length of opening as horizontally viewed. In the present instance, the swing center of the IT-CCD is just positioned at the coordinate X=0 during the vertical blanking period, as in the previous instances. When such "triangle vibration mode" is used, the effective photosensitive cell area is uniformly and continuously expanded within a swing amplitude distance over an entire area of one frame period $t_F$ consisting of two periods of fields A and B, as shown in FIG. 7B. In FIG. 7B, symbol "e" indicates a sensitivity. This arises from the fact that, during one frame period $t_F$, the IT-CCD senses the light image while always moving without the rest of the opening 40. In this instance, therefore, the ineffective area for the image sensing (the area is ineffective in photosensing or image sensing) may be remarkably reduced. When the called "trapezoidal swing mode" already referred to FIGS. 4B and 6B is used, extremely low sensitivity areas denoted as 48 are necessarily present. Accordingly, undesirable moiré signal tends to generate. Particularly, when the IT-CCD having a cell opening with a small horizontal length $A_H$ is used, the adverse influence by the false signals is serious. When the "triangle wave swing mode" shown in FIG. 7A is used, however, this problem may easily be solved.

Figure 8:
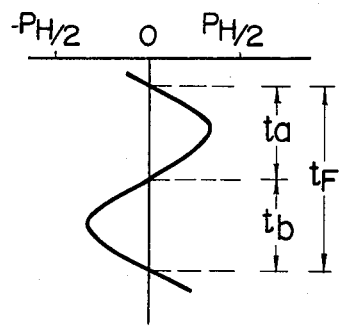
FIG. 8 shows a waveform illustrating a sinusoidal swing mode as a modification of the triangle swing mode of FIG. 7A.

In FIG. 8, there is shown a "sinusoidal wave swing mode", which may be considered as a compromise of the "trapezoidal wave swing mode" and the "triangle wave swing mode". In this instance, the amplitude is $P_H$. This instance may effect the image sensing with small ineffective area.

While having been described using the embodiment applied for the NTSC television system, the present invention is not limited by such instances in any way. In image pick-up systems other than the television system, for example, electronic camera (still camera) not using the silver salt-film and OCR, both being a closed system, the scanning system is not limited by the two-field for one frame. Therefore, if the present invention is applied for such image pick-up system, the resolution is further improved.

FIG. 9 shows a modification of the above-mentioned vibration mode when the present invention is applied for the image pick-up system of the multi-field for one frame type. In this instance, four fields A, B, C and D make up one frame. The IT-CCD 10 is vibrated radially in four directions about the vibration center 0, corresponding to four field periods, as shown in FIG. 9A. In FIG. 9A, the amplitudes of the X- and Y-axial swing components in the swing mode of this instance are, respectively, $P_G$ - $_{AG}$ and $P_G'$- $A_G'$, where $A_G$ is the horizontal (X-axial) width of the cell area and $A_G'$, the vertical (Y-axial) width. The vibration mode components in the respective directions are shown in FIGS. 9B and 9C.

Figure 9A:
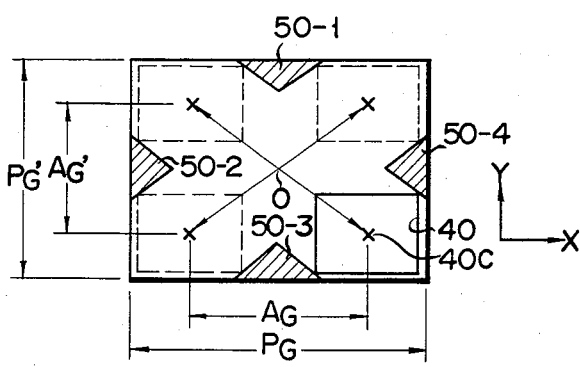
FIG. 9A illustrates a model of one cell area illustrating a swing mode adaptable for an image sensing or pick-up system in which one frame is composed of four fields.
Figure 9B:
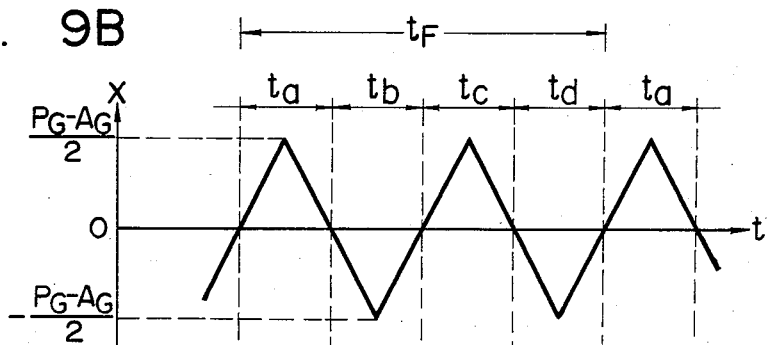
FIGS. 9B and 9C show graphs illustrating X- and Y-axial displacements of the IT-CCD swinging in the swing mode of, FIG. 9A with respect to time.
Figure 9C:
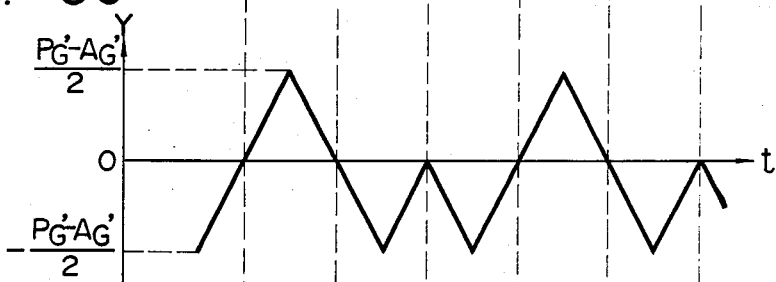
Figure 9D:
FIG. 9D illustrates a waveform of an electrical signal supplied on an FSG in the IT-CCD swinging in the swing mode of FIG. 9A.

By using such vibration mode, four effective image sensing picture elements may be obtained for one real cell during one frame period. A waveform $\phi_{FSG}$ of the pulse signal or gate control signal applied to FSG 34 (FIG. 1), and a time variation of vibration of the IT-CCD are timed as shown in FIG. 9D, and substantially the same as in FIG. 5. When the gate control signal $\phi_{FSG}$ is at high voltage level $V_H$, the IT-CCD 10 is positioned at the vibration center 0. A resolution of the reproduced picture is substantially four times that of the conventional IT-CCD which is not swinged for image sensing. In FIG. 9A, ineffective portions 50-1, 50-2, 50-3 and 50-4, which are hatched in illustration, are present. The ineffective portion 50 may easily be improved by a skilled person in the art. For example, all one it may be improved by increasing the area of the opening portion 40.

FIG. 10 shows an embodiment of the present invention which is arranged to reduce the ineffective area in the cell of the swinging IT-CCD. As shown in FIG. 10A, the IT-CCD 10 is swinged in a manner that the opening center 40c moves along zig-zag locus so as to have the horizontal swing component and the vertical swing component as well. By using this swing mode, the ineffective area is further decreased. In this case, the swing mode as shown in FIG. 10B is employed for the horizontal swing mode, and is same as that of FIG. 7. The swinging frequency of the vertical component is selected higher than that of the horizontal components, as shown in FIG. 10C. In FIG. 10C, $P_V$ is a vertical pitch length of one cell, and $A_V$ is a vertical length of the opening 40.

Figure 10A:
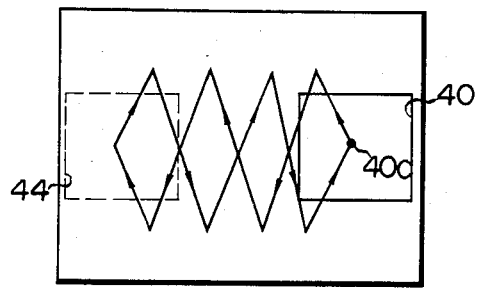
FIG. 10A shows a model of a modification of a swing mode shown in FIG. 9A.
Figure 10B:
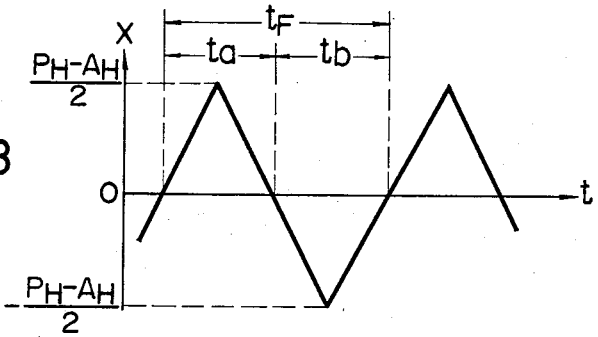
FIGS. 10B and 10C are graphs illustrating X- and Y-axial displacements of the IT-CCD swinging in the swing mode of FIG. 10A.
Figure 10C:
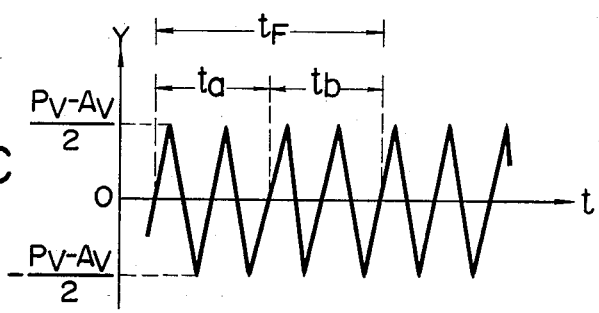
Figure 10D:
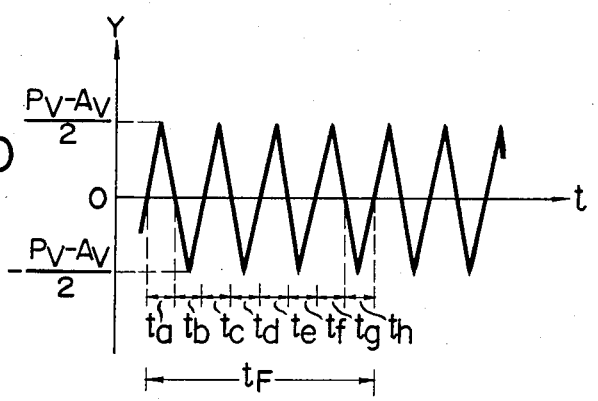
FIG. 10D shows a graph illustrating a swing waveform in a swing mode adaptable for an image sensing system of the type in which one frame is composed of eight field.

Incidentally, in a closed system, the gate control signal with a waveform $\phi_{FSG}$ like that of the above case is applied to the FSG 34 to read out the signal charge stored in the photosensitive section 32 (FIG. 1) and transfer it to the vertical CCDs $C_1$ to $C_M$, when the vibration center of the vertical swing component is positioned at Y=0, as shown in FIG. 10D. Such an arrangement enables one frame to have many fields, for example, 8 fields. In this case, as seen from FIG. 10A, the image-sensed signals obtained from the fields are overlapped one another. Nevertheless, different eight photosensing areas may be obtained from one real photosensitive cell area during one frame period. Therefore, the resolution of the reproduced picture is considerably improved.

Figure 11A:
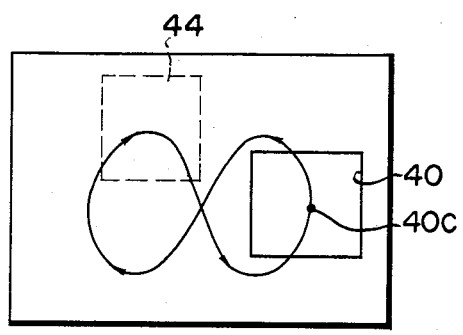
FIG. 11A is a model illustrating another modification of the swing mode shown in FIG. 9A.
Figure 11B:
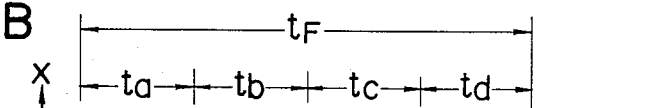
FIGS 11B and 11C show graphs illustrating X- and Y-axial displacements of the IT-CCD swinging in the swing mode shown in FIG. 11A.
Figure 11C:
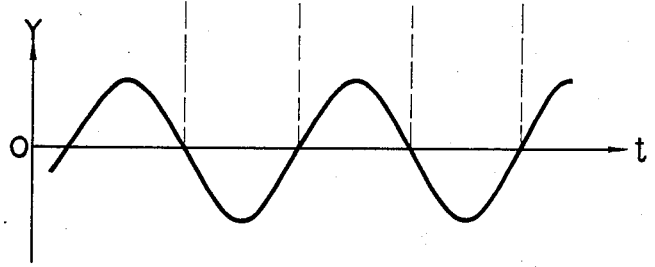

In FIG. 11, the opening 40 is swinged in "8" shape (FIG. 11A) in a plane normal to the incident image light. In the embodiment of FIG. 9, the horizontal or X-axial vibration component may be the called "triangle swing mode" shown in FIG. 9B. The waveform of the Y-axial swing component is a complicated "triangle waveform" as it is returned during the field C period. In the swing mode of FIG. 11A, the swing waveforms in the X- and Y-axial directions are simple sinusoidal waveforms, as shown in FIGS. 11B and 11C. Therefore, the swing control of the IT-CCD is simplified.

FIG. 12 shows a solid state image sensor including an IT-CCD 50 which is another embodiment of the present invention. The IT-CCD 50 is adaptable for the NTSC system. In FIG. 12, like reference numerals are used for designating like or equivalent portions in FIG. 1. The solid state image sensor is composed of a matrix array of photodiodes or picture element cells P of 2N×M (N=250 and M=400). The cell matrix includes columns of the cells $P_1$ to $P_M$. Each cell column contains picture element cells of 2N $P_{11}, P_{11}', \ldots, P_{1N}, P_{1N}', \ldots, P_{MN}, P_{MN}'$. The vertical CCDs $C_1$ to $C_M$ of M are arranged in opposition to the cell columns $P_1$ to $P_M$, with the FSG 34 interposing therebetween. The vertical CCDs $C_1$ to $C_M$ have the same number of transfer stages as the picture elements contained in the cell columns $P_1$ to $P_M$. The first vertical CCD column $C_1$ includes transfer elements of 2N $C_{11}, C_{11}', \ldots, C_{1N}, C_{1N}'$. The same thing is true for the remaining vertical CCD columns. The signal charges stored in the photocells $P_{11}, P_{11}', \ldots, P_{1N}, P_{1N}'$ in each photocell columns $P_1$ to $P_M$ are respectively and independently transferred to the transfer elements $C_{11}, C_{11}', \ldots, C_{1N}, C_{1N}'$ in opposition to the vertical CCDs $C_1$ to $C_M$ through the FSG 34, during the horizontal effective period. The signal charges loaded into the vertical CCDs $C_1$ to $C_M$ are successively transferred to every unit of transfer elements of which the number is the same as that of the photocells included in each vertical cell columns. In the horizontal effective period, the charges are further transferred in a horizontal shift register S, and then produced through the amplifier 30 and the output terminal 36 in successive order.

The IT-CCD 50 of FIG. 12 horizontally vibrates or swings in a plane normal to the incident image light and relative to the incident image light, according to the called "trapezoidal wave swing mode". The technique of vibrating the IT-CCD has already been described and hence no further explanation thereof will be given here.

Figure 13:
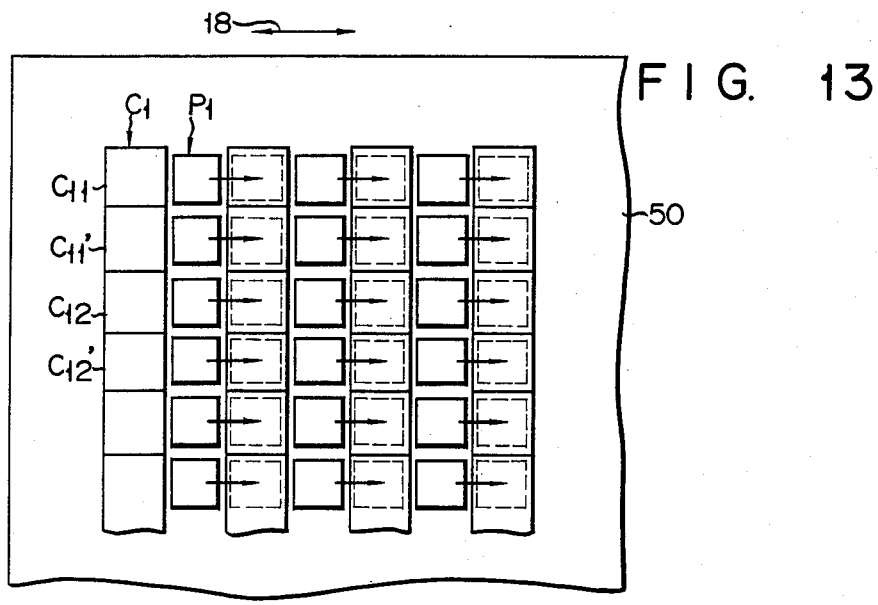
FIG. 13 shows a partial plan view of the image sensing area of the IT-CCD for illustrating a displacement of a cell matrix of IT-CCD when the FIG. 12 IT-CCD is horizontally vibrated.

FIG. 13 shows a model of a moving state of the photosensitive section in the horizontal direction when the IT-CCD 50 of FIG. 12 swings in the "trapezoidal wave vibration mode". The amplitude of the vibration is ½ of the horizontal picture element pitch. In FIG. 13, during the field A in one frame period, the IT-CCD 50 just rests at a first image sensing position as indicated by a solid line. At the first image sensing position, it senses the incident light image. During the field B period, it rests at the second image sensing position as indicated by a dotted line in FIG. 13. The movement of the signal charges stored in the photocells to the vertical CCDs during each field period, is performed during a period corresponding to the vertical blanking period in the scanning operation at the picture reproducing stage, for executing an effective image sensing operation. Accordingly, during the fields A and B of one frame period, the image information may be obtained at first and second image-sensing positions which are shifted ½ pitch of the picture element from one another. Therefore, the present embodiment may attain a high horizontal resolution with the photocells 2N×M, or 500, and the horizontal resolution is comparable with that of the high density CCD with 1,000 picture element cells. According to the present embodiment, the signal charges stored in the photocells are independently transferred to the corresponding transfer elements of the vertical CCD, respectively. Therefore, it is prevented that the signal charges from the picture elements adjacent to each other as viewed vertically are mixed when the signal charges are transferred in the vertical CCD. This feature is useful in improving the picture quality or the resolution of the reproduced picture.

Figure 14:
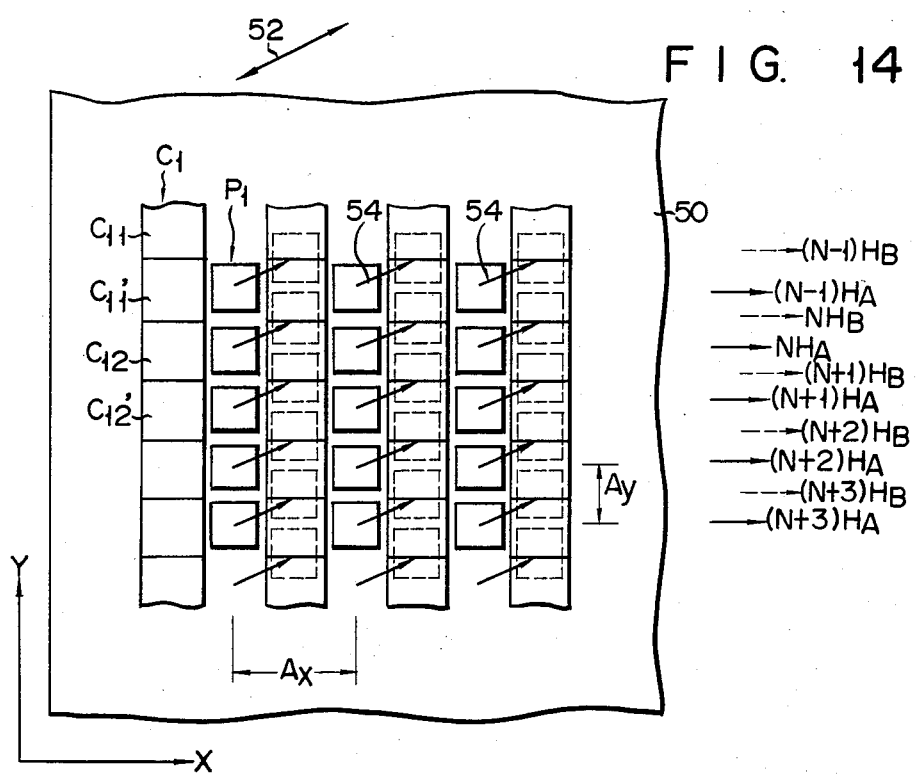
FIG. 14 shows a partial plan view of the image sensing area of the IT-CCD for illustrating a displacement of the cell array for vibrating the FIG. 12 IT-CCD in a slanted direction.

FIG. 14 shows an embodiment of the invention which may improve the horizontal resolution and the vertical resolution using a modification of the swing mode shown in FIG. 13. In FIG. 14, the IT-CCD 50 vibrates or swings in a slanted direction denoted as reference numeral 52. Also in this case, the X- and Y-axial swing components have the "trapezoidal wave vibration mode", for example. The X-axial swing component has an amplitude of the half of the photocell pitch length $A_x$ as horizontally viewed. The Y-axial vibration component has an amplitude of the half of the cell pitch $A_y$ as vertically viewed. The movement of the photocell $P_{ij}$ of the IT-CCD 50 vibrating in such vibration mode is indicated by an arrow 54. During the field A period, each of picture element cells rests at a first image sensing position as indicated by a solid line in FIG. 14 and the image sensing is thus performed at this position. During the field B period, the cells stop and rest at a second image sensing position as indicated by a dotted line, which is different from the first image sensing position in the FIG. 13 embodiment. During this period, the image sensing is performed at this position. This operation is repeated every frame period.

For reproducing the image signal obtained according to the present image sensing system, the field image read out in synchronism with the read out clock in the fields A and B may easily provide a normal reproduced picture by vertically shifting them by the ½ picture element period. According to this image sensing system, as shown in FIG. 14, the field image signal components $(N-1)H_A$, $NH_A$, $(N+1)H_A$, $(N+2)H_A$, $(N+3)H_A$, ... are read out in the field A period. In the field B period, the field picture signal components $(N-1)H_B$, $NH_B$, $(N+1)H_B$, $(N+2)H_B$, $(N+3)H_B$, ... are read out. Therefore, the interlacing image sensing is performed not only in the horizontal direction but also in the vertical direction, corresponding to the interlacing scanning in the picture display. Almost ideal interlacing image sensing is possible, accordingly. Thus, a high vertical resolution comparable with that as given by 1,000 vertical scanning lines can be attained. Further, the horizontal resolution may be improved doubly.

Figure 15A:
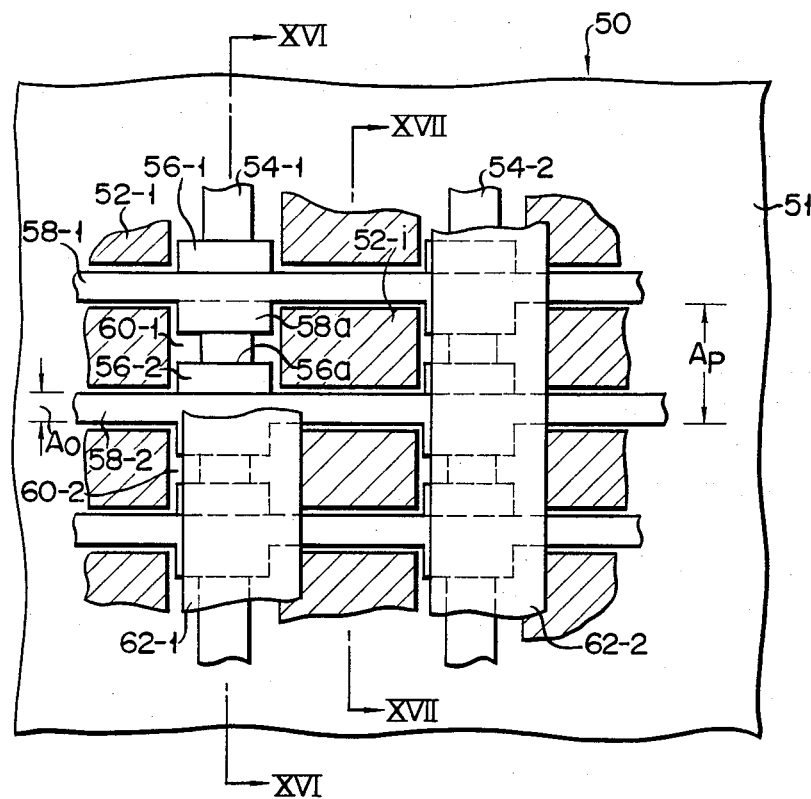
FIG. 15A is a partial plan view showing the practical structure of the IT-CCD of FIG. 12.
Figure 15B:
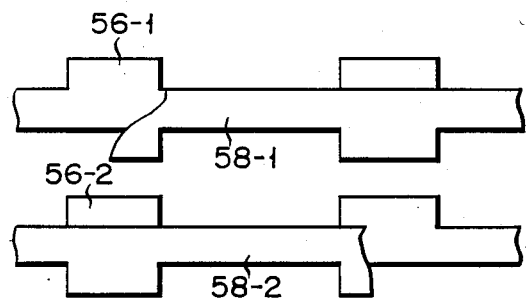
FIG. 15B shows an enlarged plan view of a part of the IT-CCD for definitely illustrating electrode layers overlaid with respect to each other in FIG. 15A.

A practical arrangement of the IT-CCD 50, which is well adaptable for the two embodiments shown in FIGS. 12 to 14, will be described referring to FIGS. 15 to 17. FIG. 15A is a plan view of a planar structure of a part of the IT-CCD 10 formed on the substrate 51. In the figure, the photodiode areas 52-1, ..., 52-i, ... serving as photocells are shaded only for ease of illustration. Vertical CCD channels 54-1, 54-2, ... extend between cell columns including the cell regions 52-1, ..

..., 52-i on the substrate 51 in parallel fashion. Formed on the vertical CCD channels 54-1, 54-2, ... are first transfer electrodes 56-1, 56-2, ... forming a first layer, which extend normal to the CCD channels 54-1, 54-2, ... Second transfer electrodes 58-1, 58-2, ... forming a second layer are further formed on the first transfer electrodes 56-1, 56-2, ... The planar structure of the first and second transfer electrodes 56 and 58 are clearly illustrated in an enlarged manner in FIG. 15B. A gap 60-1 extends between a convex portion 58a of the second transfer electrode 58-1 and a convex portion 56a of the first transfer electrode 56-2. The gap 60-1 is located at about mid-point in the width $A_p$ of the cell column in the vertical direction. The remaining electrodes are also arranged in a similar fashion. In FIG. 15A, only one of the other gaps is typically illustrated using reference numeral 60-2. Third electrode layers 61-2, 62-2, ... are formed on the columns of the convex portion 58a, ...

Figure 16:
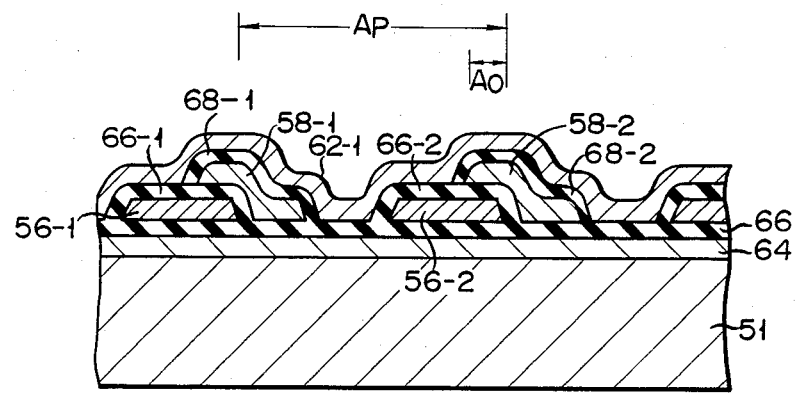
FIG. 16 shows a partial cross sectional view taken on line XVI—XVI.
Figure 17:
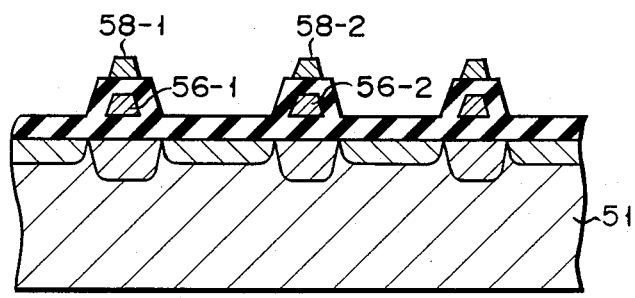
FIG. 17 shows a partial cross sectional view illustrating a cross sectional view taken on line XVII—XVII in FIG. 15A.

FIG. 16 shows a cross sectional view of the IT-CCD 50 taken on line XVI—XVI in FIG. 15A. An N+layer 64 serving as a buried channel is deposited on the top surface of the substrate 51 made of P type silicon, for example. A gate oxide film 66 is deposited on the N+layer 64. The first transfer electrodes 56-1, 56-2, ... are formed on the gate oxide film 66. The second transfer electrodes 58-1, 58-2, ... partially overlay the first transfer electrodes 56-1, 56-2, ..., through insulative films 66-1, 66-2, ... The overlaying portion of these electrodes are denoted as $A_o$. After insulative films 68-1, 68-2, ... are formed on the structure, the electrode layer 62-1 is deposited.

Three phase clock pulse voltages are applied to the first to third transfer electrodes 56, 58 and 62, respectively. With the application of the pulse voltages, a transfer element or a transfer unit is formed, which is composed of the first transfer electrode 56-2, the second transfer electrode 58-1, and the third transfer electrode 62-1 between the adjoining first and second transfer electrodes. The transfer unit corresponds to one transfer stage of the vertical CCD. The cross sectional structure of the IT-CCD 50 taken along line XVII—XVII in FIG. 15A, has a simple structure in which the first transfer electrodes 56-1, 56-2, ... and the second transfer electrodes 58-1, 58-2, ... are laid one upon another, as shown in FIG. 17. The IT-CCD 50 thus arranged is simple in construction and has little deterioration of sensitivity, and is preferable for the present invention.

Although the present invention has been shown and described with respect to particular embodiments, nevertheless, various changes and modifications which are obvious to a person skilled in the art to which the invention pertains are deemed to lie within the spirit, scope, and contemplation of the invention.

In the above-described embodiments, in order to attain a relative swing between the incident image light rays and the solid state image sensor such as the IT-CCD, the image sensor itself is swinged. It should be understood that the present invention is not limited by such embodiments. For example, the incident image light rays may be swinged against the image sensing face of the image sensor which is at a standstill.

Figure 18:
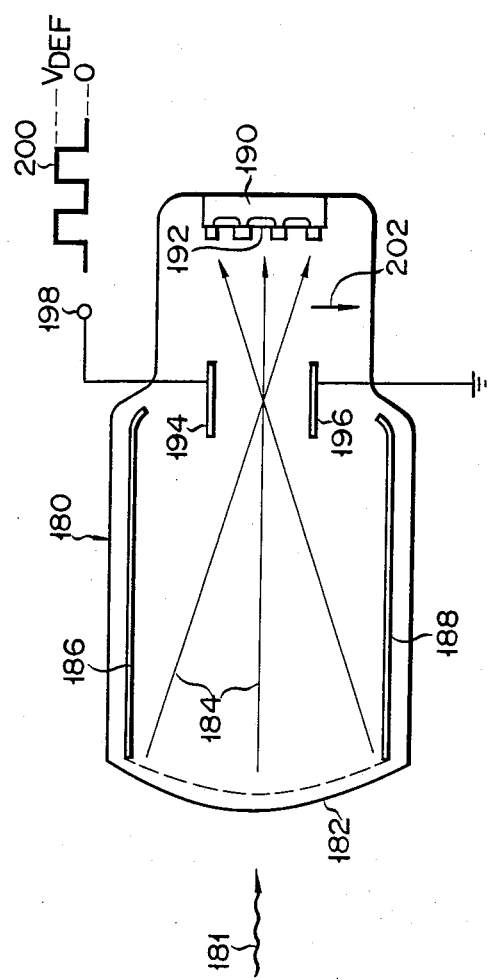
FIG. 18 is a longitudinal cross sectional view of an image intensifier which is another embodiment of the present invention.

This instance will be described in detail referring to FIG. 18. FIG. 18 shows a horizontal cross section of an image intensifier 180 of the electron impact type. When the image light 181 is incident on the photosensitive face, photoelectrons as directed by an arrow 184 are radiated from the photosensitive face 182. The photoelectrons 184 are accelerated and focused by an electric field developed in the internal space of the image intensifier 180 with aid of the electrodes 186 and 188. Then, the photoelectrons hit the solid state image sensor with an image sensing face 192 disposed in opposition to the photosensitive face 182 in the internal space of the image intensifier 180. The photoelectrons are converted into a great number of electron-hole pairs according to the known electron multiplying effect. The image intensifier 180 is further provided with a pair of deflection electrode plates 194 and 196. The electrode plates 194 and 196, provided in the image intensifier 180, are arranged oppositely each other with the photoelectron path located therebetween.

Of these electrodes, the electrode plate 196 is grounded and the electrode 194 is electrically connected to the signal input terminal 198. When this embodiment is used in NTSC television system, a deflection control signal with a pulsate wave shape 200 is applied to the terminal 198. In a field A period, the voltage applied to the polarizing electrode 194 is zero. In the field B period, it is a deflection voltage $V_{DEF}$. Accordingly, when the field period is shifted from the field A period to the field B period, the photoelectrons 184 are deflected in the horizontal direction of an arrow 202 by an amount of deflection corresponding to an intensity of the deflection field developed between the electrodes 194 and 196 by the deflection voltage $V_{DEF}$ applied therebetween. When it returns to the field A period, the deflection field disappears, so that the electron stream takes again the optical path as indicated by a solid line. This operation is repeated to substantially double the optical data collecting area of a CCD 190. Therefore, it is seen that according to the theory already described referring to FIGS. 1 through 14, the incident light image may be picked up with the doubled resolution.

The present invention, which has been described using the IT-CCD, may of course be embodied using a frame transfer CCD (FT-CCD) as described in a paper bearing a title "512×340 Picture Elements Image Sensor" in Journal of Television Institute, pp. 536 to 541, July, Vol. 33, No. 7. A common point in the image sensing operation by the solid state image sensor chip substrate between these CCD systems resides in that the signal charges stored in the photosensitive portion of each cell are simultaneously read out during the vertical blanking period. This fact implies that the solid state image sensor chip substrate, if it has the function resemble with that of these CCD systems, may be used for the present invention. In the above-mentioned embodiments, the shape of the opening 40 was rectangular for ease of explanation. If the opening has other shapes, the number of the sampling points are not decreased. Such shapes may of course be involved in this invention. The IT-CCD shown in FIGS. 2 and 3 employs photosensitive cells $P_{ij}$, $P_{ij}'$ vertically arrayed in a line in each cell column, as described above. The photosensitive cells may be arrayed in a zig-zag fashion. The zig-zag arrayed photosensitive portions will further improve the resolution in question.

It is evident that this invention is applicable for a color television camera with one, two or three image sensors. If the combination of this invention and the picture elements swinging method as mentioned above is applied for the two- or three-plate television camera, the resolution is further improved.

The amplitude of the vibration is shorter than the cell pitch in the aforementioned embodiments. In the single-plate color television camera, the picture element pitch is longer than that of the above-mentioned case. Therefore, if the present invention is applied for the single-plate color television camera, it is preferable to extend the swing amplitude up to the distance between the adjacent cells, for lessening the moiré signals produced for the color signal. The present invention may change the vibration amplitude so long as the high resolution is kept.

The present invention is also applicable for a called two-stage sensor in which a photoconductive film is used for the photoelectric conversion, and the conventional silicon single crystal substrate, for example, is used for the read scanning.

In the FIGS. 4 to 11 embodiments, the time point of the signal charge shift from the photosensitive portions to the vertical CCDs $C_1$ to $C_M$ is exactly coincident with the time that the vibrating IT-CCD passes the vibration center. This time coincidence between them is not essential in the present invention, however. In contract with this, these timings may be shifted positively. If so, the increased sensitivities of the picture elements of the vibrating CCD are superposed to prevent undesirable phenomenon originating from the false signal generation, such as moiré.

What we claim is:

1. A solid state image sensor for sensing a light image compatible with a predetermined television system in which one frame includes a plurality of fields including first and second fields, said image sensor comprising:

a solid state image sensing device including a substrate and a photosensing region formed on said substrate, for receiving an incident light image to generate and store therein signal charges corresponding to said light image wherein said photosensing region includes at least one linear cell array containing a predetermined number of cells, said solid state image sensing device further comprising a transfer means disposed adjacent to said linear cell array, for reading out and transfering the charges stored in said cells, said transfer means including at least one linear transfer section extending along said linear cell array; and deflection means mechanically coupled to said solid state image sensing device, for swinging said substrate in prescribed swing mode in such a manner that each cell is located at different sensing positions during different field periods in one frame period of the television system, whereby signal charges stored in the first filed period is simultaneously read out from the cell array to the transfer section before said each cell is located at the subsequent positions for storing signal charges corresponding to an image of the second field, whereby an image resolution of the one frame image is improved with respect to the whole area of said frame image.

2. The solid state image sensor according to claim 1, wherein said deflection means controls the positional change of each of said cells during each of said frame periods such that each cell of said image sensing device crosses a predetermined swing center position in synchronism with the read out operation of the signal charges corresponding to the first field image from said cell array to said transfer section.

3. The solid state image sensor according to claim 2, wherein said image sensing device further includes an interline transfer type solid state charge coupled device comprising a matrix array of photocells of $2N \times M$ (N, M; positive intergers) having cell columns of M which are arrayed in parallel with one another and each of which has 2N photocells linearly arrayed, each of said photocells being swung by said deflection means so as to be located at different sampling positions during the different field periods than the one frame period.

4. A solid state image sensor according to claim 3, wherein said image sensing device further comprises:

M charge tranfer sections which are disposed adjactent to and extend along said M cell columns and which simultaneously read out and trasfer the signal charges corresponding to the field image stored in said cell columns with radiation of said light image during the corresponding field period; and a shift register which is connected to said charge transfer sections and which sequentially transfers the signal charges coming from said charge transfer sections during each field period included in said one frame period.

5. The solid state image sensor according to claim 3, wherein, when said television system is NTSC system in which one frame is composed of first and second fields, said deflection means reciprocately moves said substrate of said image sensing device in said plane so as to make each of said cell columns rest at a first image sensing position during a first field image sensing period, and to make each of said cell columns rest at second field image sensing position during a second field image sensing period.

6. The solid state image sensor according to claim 5, wherein said image sensing device further comprises field shift gate means formed on said substrate surface and extending among said M cell columns and said M charge transfer sections, and having M field shift gate sections electrically connected to one another, and for simultaneously transferring to said charge transfer sections signal charges stored in said cell columns substantially in synchronism with a rapid movement of each of said cell columns between said first and second image sensing positions.

7. The solid state image sensor according to claim 6, wherein each of said charge transfer sections has the same number of transfer elements, 2N, as that of said photocells contained in each of said cell columns, whereby the signal charges stored in said photosensitive cells of each of said cell columns are transferred to said transfer elements by said field shift gate means, respectively.

8. The solid state image sensor according to claim 3, wherein, when said television system is NTSC system in which one frame is composed of first and second fields, said deflection means swings said substrate of said image sensing device in said plane so as to substantially always move between said first and second positions in a reciprocal manner, whereby said cell columns perform the image sensing operation during one frame period, while substantially moving.

9. The solid state image sensor according to claim 8, wherein said image sensing device further comprises field shift gate sections formed on said substrate surface and extending among said M cell columns and M charge transfer sections and connected electrically to one another, said field shift gate sections simultaneously transferring the signal charges which are stored in said cell columns substantially at the time that each of said cell columns reaches the substantially center position between said first and second positions.

10. The solid state image sensor according to claim 9, wherein each of said charge transfer sections has the same number of transfer elements, 2N, as that of said photocells contained in each of said cell columns, whereby the signal charges stored in said photosensitive cells of each of said cell columns are transferred to said transfer elements by said field shift gate means, respectively.

11. The solid state image sensor according to claim 7, wherein said cell columns are arranged equidistantly, and wherein said deflection means swings said substrate in said plane and in the direction substantially orthogonal to the extending direction of said cell columns, and in a manner that a distance between said first and second image sensing positions is preferably half of the interval of said cell columns.

12. The solid state image sensor according to claim 7, wherein said cell columns are arranged equidistantly, and wherein said deflection means swings said substrate in said plane, in the direction oblique to the extending direction of said cell columns, and so that a first distant component of the distance between said first and second image sensing positions, which is directed normal to said cell column extending direction, is preferably equal to the half of the interval between said cell columns, and a second distance component in the extending direction of said cell columns is preferably equal to the half of the pitch of said photocells of 2N contained in each of said cell columns.

* * * * *